(12) United States Patent
Takeya et al.

(10) Patent No.: US 10,256,164 B2
(45) Date of Patent: Apr. 9, 2019

(54) SEMICONDUCTOR FILM AND FIELD EFFECT TRANSISTOR HAVING SEMICONDUCTOR AND POLYMER PORTIONS STACKED ADJACENT EACH OTHER

(71) Applicant: The University of Tokyo, Bunkyo-ku, Tokyo (JP)

(72) Inventors: Junichi Takeya, Tokyo (JP); Junshi Soeda, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/506,271

(22) PCT Filed: Aug. 28, 2015

(86) PCT No.: PCT/JP2015/074448
§ 371 (c)(1),
(2) Date: May 25, 2017

(87) PCT Pub. No.: WO2016/031968
PCT Pub. Date: Mar. 3, 2016

(65) Prior Publication Data
US 2018/0053701 A1    Feb. 22, 2018

(30) Foreign Application Priority Data
Aug. 29, 2014   (JP) ................. 2014-175793

(51) Int. Cl.
*H01L 23/13* (2006.01)
*H01L 23/14* (2006.01)
(Continued)

(52) U.S. Cl.
CPC .............. *H01L 23/14* (2013.01); *H01L 23/13* (2013.01); *H01L 25/00* (2013.01); *H01L 29/786* (2013.01);
(Continued)

(58) Field of Classification Search
CPC ......... H01L 23/13; H01L 23/14; H01L 25/00; H01L 27/0218; H01L 28/26
See application file for complete search history.

(56) References Cited

U.S. PATENT DOCUMENTS
2012/0037891 A1    2/2012 Cho et al.

FOREIGN PATENT DOCUMENTS
EP    3 125 298 A1    1/2017
JP    2005-243822 A    9/2005
(Continued)

OTHER PUBLICATIONS

Extended European Search Report issued in Patent Application No. EP 15 83 5627 dated Mar. 29, 2018.
(Continued)

*Primary Examiner* — Hoai V Pham
(74) *Attorney, Agent, or Firm* — Pearne & Gordon LLP (57) ABSTRACT

The present invention provides a semiconductor film, a field effect transistor, and a method of fabricating the semiconductor film that has one or two or more semiconductor portions, which are formed from a semiconductor material, and one or two or more polymer portions, which are formed from a polymer material. The semiconductor portion and the polymer portion are adjacent to each other and are integrated.

3 Claims, 12 Drawing Sheets

(51) Int. Cl.
*H01L 29/786* (2006.01)
*H01L 25/00* (2006.01)
*H01L 51/00* (2006.01)
*H01L 51/05* (2006.01)

(52) U.S. Cl.
CPC ........ *H01L 51/0003* (2013.01); *H01L 51/052* (2013.01); *H01L 51/0558* (2013.01)

(56) References Cited

FOREIGN PATENT DOCUMENTS

| | | |
|---|---|---|
| JP | 2006-013492 A | 1/2006 |
| JP | 2012-033904 A | 2/2012 |
| JP | 2013-058680 A | 3/2013 |
| JP | 2013-177347 A | 9/2013 |
| WO | 2006/019133 A1 | 2/2006 |
| WO | 2009/084584 A1 | 7/2009 |
| WO | 2013/172143 A1 | 11/2013 |
| WO | 2014/008395 A1 | 1/2014 |

OTHER PUBLICATIONS

Soeda, Junshi, "Inch-Size Solution-Processed Single-Crystalline Films of High-Mobility Organic Semiconductors", Applied Physics Express, vol. 6, No. 7, Jun. 20, 2013, p. 076503, Japan-13 Cited in EESR.
Wang, Xiaohong, et al. "Self-Stratified semiconductor/dielectric polymer blends: vertical phase separation for facile fabrication of organic transistors", Journal of Materials Chemistry C, RSC Publishing, (2013), pp. 3989-3998—Cited in EESR.
International Search Report from Corresponding Application No. PCT/JP2015/074448; dated Nov. 16, 2015.

SEMICONDUCTOR FILM AND FIELD EFFECT TRANSISTOR HAVING SEMICONDUCTOR AND POLYMER PORTIONS STACKED ADJACENT EACH OTHER

TECHNICAL FIELD

The present invention relates to a semiconductor film, a field effect transistor, and a method of fabricating a semiconductor film, and is applied particularly to a semiconductor material that dissolves in a solvent.

BACKGROUND ART

As for a semiconductor material that dissolves in a solvent, an organic semiconductor material, for instance, is known. An organic field effect transistor (OFET) is a field effect transistor that includes a thin film (hereinafter referred to as "organic semiconductor film"), which is used as an active layer, formed from an organic semiconductor material. Conventionally, an ink jet method and a spin coating method are generally known as a technology for forming the organic semiconductor film.

However, these methods cannot control the orientation of the molecules in the organic semiconductor film. Accordingly, the formed organic semiconductor film has such a problem that the orientations thereof are not aligned, so that the charge mobility is low. Specifically, the polycrystalline organic semiconductor film has high electric resistance in grain boundaries, and accordingly the charge mobility becomes low.

In response to this problem, a method is disclosed that precipitates crystals from a solution containing an organic semiconductor material, and thereby fabricates an organic semiconductor film having high charge mobility (for instance, Patent Literature 1).

CITATION LIST

Patent Literature

Patent Literature 1: Japanese Patent Laid-Open No. 2013-177347

SUMMARY OF INVENTION

Technical Problem

However, in the above-described fabrication method according to Patent Literature 1, there has been a problem that conditions for growing crystals need to be precisely controlled, making the fabrication difficult.

An object of the present invention is to provide a a semiconductor film, a field effect transistor, and a method of fabricating a semiconductor film capable of easily fabricating a semiconductor film in which orientations are aligned.

Solution to Problem

A semiconductor film according to the present invention has one or two or more semiconductor portions that are formed from a semiconductor material, and one or two or more polymer portions that are formed from a polymer material. The semiconductor portion and the polymer portion are adjacent to each other and are integrated.

A field effect transistor according to the present invention includes the semiconductor film.

A method of fabricating a semiconductor film according to the present invention includes a step of applying a coating liquid onto a substrate while moving a nozzle or the substrate in one direction. A semiconductor material and a polymer material are dissolved in a solvent in the coating liquid. The nozzle supplies the coating liquid onto the substrate. After the solvent has evaporated, a semiconductor portion that is formed from the semiconductor material and a polymer portion that is formed from the polymer material are adjacent to each other and are integrated, and thereby the semiconductor film in which orientations are aligned is formed.

Advantageous Effects of Invention

According to the present invention, the semiconductor film in which the orientations are aligned is formed by applying the coating liquid, in which the semiconductor material and the polymer material are dissolved in the solvent. In the present invention, the fabrication conditions are not limited as in the conventional methods, and accordingly the semiconductor film having high charge mobility is easily fabricated. The semiconductor film may be formed by a method other than the application method, by adjusting the viscosity of the coating liquid and the time for drying the coating liquid.

BRIEF DESCRIPTION OF THE DRAWINGS

FIGS. 8A and 8B show polarization microscope photographs of the organic semiconductor film according to Modified Example (1): FIG. 8A is a photograph at a diagonal position; and FIG. 8B is a photograph at an extinction position.

FIGS. 18A, 18B, and 18C show data of the organic semiconductor film (4) according to the present embodiment: FIG. 18A is an optical microscope photograph; FIG. 18B is a polarization microscope photograph; and FIG. 18C is a graph showing the measurement result of the height of the surface.

FIGS. 19A and 19B show data of a polymer portion in the organic semiconductor film (4) according to the present embodiment; FIG. 19A is an atomic force microscope (AFM: Atomic Force Microscope) image; and FIG. 19B is a graph showing the measurement result of the height of the surface.

FIGS. 20A and 20B are results of X-ray diffraction (XRD: X-ray diffraction) of the organic semiconductor film (4) according to the present embodiment: FIG. 20A is an out-of-plane X-ray diffraction pattern; and FIG. 20B is a transmission X-ray diffraction image.

DESCRIPTION OF EMBODIMENTS

Embodiments according to the present invention will be described in detail below with reference to the drawings.

(Overall Configuration)

Figure 1:
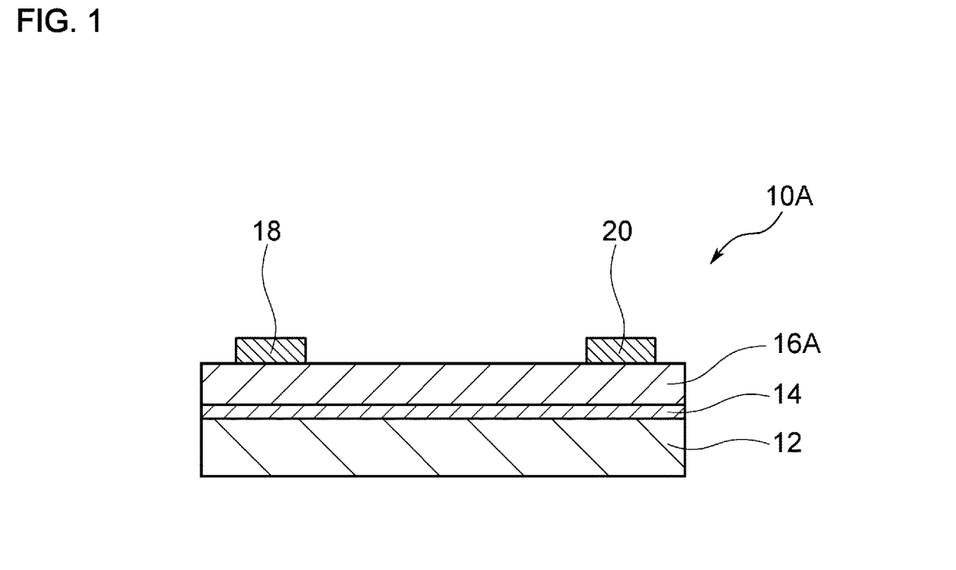
FIG. 1 is a longitudinal sectional view showing a schematic configuration of an organic FET according to present embodiment.

An organic FET 10A, which is a field effect transistor (hereinafter referred to as FET), shown in FIG. 1, includes: a gate electrode 12; a gate insulating film 14; an organic semiconductor film 16A, which is a semiconductor film; a source electrode 18; and a drain electrode 20. The organic FET 10A according to the present embodiment is a so-called bottom gate type, in which the gate electrode 12 is disposed under the organic semiconductor film 16A. The organic FET 10A is a top contact type, in which the source electrode 18 and the drain electrode 20 are disposed on the upper surface of the organic semiconductor film 16A.

The gate electrode 12 is formed from an inorganic material such as Al, Ta, Mo, Nb, Cu, Ag, Au, Pt, In, Ni, Nd, Cr, silicon (polysilicon, amorphous silicon, highly doped silicon and the like), tin oxide, indium oxide, or an indium tin compound (Indium Tin Oxide: ITO), or an organic material such as a doped conducting polymer.

The gate insulating film 14 is formed from an inorganic material such as $SiO_2$, SiN, $Al_2O_3$, or $Ta_2O_5$, or a polymer material such as polyimide or polycarbonate.

The organic semiconductor film 16A includes a semiconductor portion and a polymer portion. The semiconductor portion is formed from an organic semiconductor material, which is a semiconductor material. The polymer portion is formed from a polymer (or macromolecular) material. In the present embodiment, the semiconductor portion and the polymer portion have layer shapes (sheet shapes), respectively. The semiconductor portion is formed on the polymer portion. The semiconductor portion may include a portion which contains the organic semiconductor material as a main component and also contains the polymer material. The polymer portion may include a portion which contains the polymer material as a main component and also contains the organic semiconductor material.

Examples of the organic semiconductor material include, $C_{10}$-DNBDT, $C_6$-DNTVW, $C_{10}$-DNTT, $C_8$-BTBT and TIPS-Pentacene, which are soluble p-type organic semiconductors; and $PDIF-CN_2$, which is a soluble n-type organic semiconductor material.

Examples of the polymer material include polymer materials which are soluble in a solvent, such as polymethyl methacrylate resin (PMMA: poly(methyl methacrylate), poly(4-methylstyrene) (P4MS), poly(triarylamine) (PTAA), polystyrene (PS), polyacrylonitrile (PAN), polyethylene (PE), and polyvinyl acetate (PVA).

The source electrode 18 and the drain electrode 20 may be formed from the same type of material as that of the gate electrode 12, or may be formed from the same material as or a material different from the material of the gate electrode 12. Different types of materials may be stacked to form the source electrode 18 and the drain electrode 20.

(Fabrication Method)

Next, a method of fabricating the organic semiconductor film 16A will be described below. First, a coating liquid is prepared, in which the organic semiconductor material and the polymer material are dissolved in a solvent. Examples of the usable solvent include a halogen-based aromatic solvent such as chlorobenzene (CB), 3-chlorothiophene (3CT), and 1-chloronaphthalene (1CN); a hydrocarbon solvent such as hexane and heptane; and a halogen-free aromatic solvent such as toluene, xylene, and tetralin. However, the solvent is not limited to the above-described solvents, as long as the solvent dissolves both of the organic semiconductor and the polymer.

Figure 2:
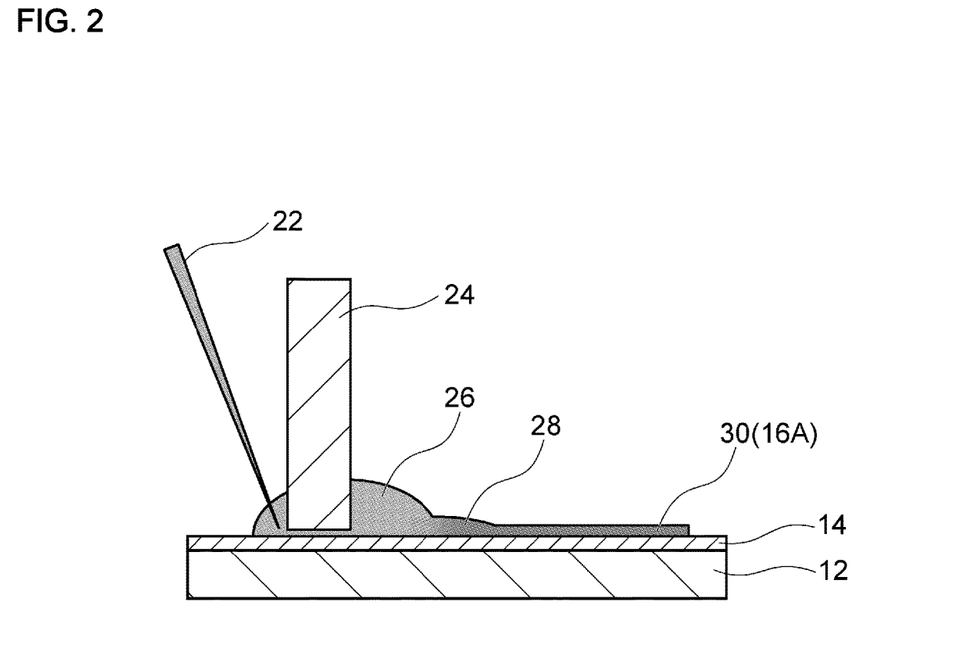
FIG. 2 is a view schematically showing a fabrication method of an organic semiconductor film according to the present embodiment.

Next, as is shown in FIG. 2, the coating liquid is applied onto the surface of the gate insulating film 14 that has been formed on the gate electrode 12, which is a substrate, by an edge casting method. The edge casting method will be described below.

A nozzle 22 and a blade 24 are disposed on the gate insulating film 14. The coating liquid 26 is supplied from the nozzle 22 to an edge portion of the blade 24. The edge portion faces the surface of the gate insulating film 14. The nozzle and the substrate are kept at a temperature at which the solvent evaporates. The substrate 12 (14) is moved in one direction while the coating liquid 26 is continuously supplied to the edge portion so that the amount of the coating liquid 26 held by the edge portion is constant. As for the coating liquid 26 that has been supplied from the nozzle 22, the organic semiconductor material is crystallized as the solvent evaporates. The coating liquid 26 is applied while the substrate 12 (14) is moved in one direction, and accordingly the solvent sequentially evaporates along the moving direction of the substrate 12 (14), and the organic semiconductor material is sequentially crystallized along with the evaporation. In the present embodiment, the coating liquid 26 contains the polymer material. Hence the solvent evaporates in a longer time period than that of a conventional coating liquid which does not contain the polymer material. The polymer material contained in the coating liquid 26 maintains a state (28 in the figure) allowing the organic semiconductor material to flow, until the evaporation of the solvent ends. Thereby, the time in which the organic semiconductor material remains flowing is longer than that of a conventional organic semiconductor material. Thus, the organic semiconductor material takes a longer time to solidify.

In a process in which the solvent evaporates, the phases of the polymer material and the organic semiconductor material are each separated into a layer shape (sheet shape). Thereby, the organic semiconductor material is crystallized while being oriented on the layer-shaped polymer portion (30 in the figure). Thereby, the layer-shaped semiconductor portion in which the orientations are aligned is formed on the layer-shaped polymer portion. In the semiconductor portion, a difference in angle between the orientation axes of the crystals is preferably 10 degrees or less, and more preferably is 5 degrees or less. Furthermore, the semiconductor portion is most preferably a single crystal. In such a semiconductor portion in which the orientations are aligned, the length of the crystal is preferably 200 μm or more.

The source electrode 18 and the drain electrode 20 are formed on the organic semiconductor film 16A produced as described above. Thus, the organic FET 10A is fabricated.

The substrate 12 (14) may be moved in a meandering manner with respect to the nozzle 22 and the blade 24 while the coating liquid 26 is applied.

(Action and Effect)

The above-configured organic semiconductor film 16A is formed by applying the coating liquid, in which the organic semiconductor material and the polymer material are dissolved in the solvent, with an edge casting method. Thereby, the organic semiconductor film 16A, in which the orientations are aligned, is formed. According to the present embodiment, the organic semiconductor film 16A having high charge mobility is fabricated easily, because the fabrication conditions are not limited as in the conventional methods.

The organic semiconductor film 16A according to the present embodiment is a bent-shaped organic semiconductor molecule. Hence, the organic semiconductor film 16A is excellent in heat resistance, and not decomposed in a temperature range from room temperature to 270° C., and structural phase transition does not occur.

EXAMPLE

The organic semiconductor film 16A was fabricated according to the procedures in the above-described "fabrication method". A coating liquid was prepared by mixing and dissolving 0.025 wt % of $C_{10}$-DNBDT, which was used as the semiconductor material, and 0.025 wt % of PMMA, which was used as the polymer material, in 3CT, which was used as the solvent.

Figure 3:
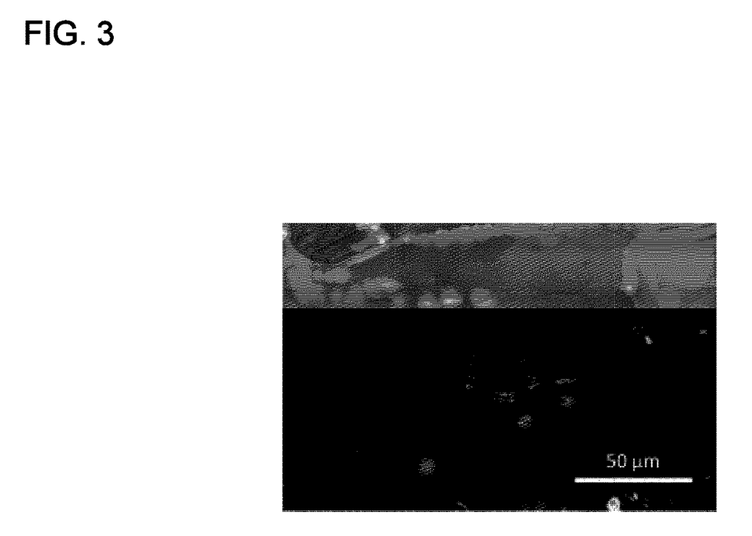
FIG. 3 is a polarization microscope photograph of an organic semiconductor film (1) according to the present embodiment.
Figure 4:
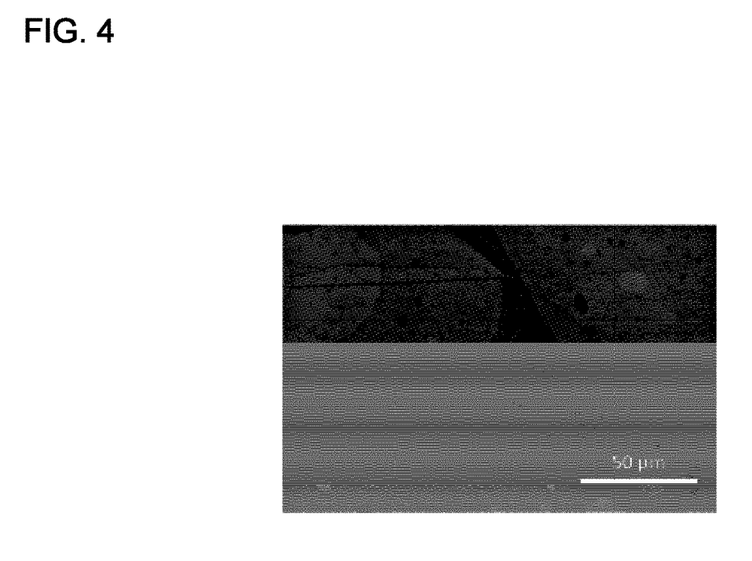
FIG. 4 is a polarization microscope photograph of an organic semiconductor film (2) according to the present embodiment.
Figure 5:
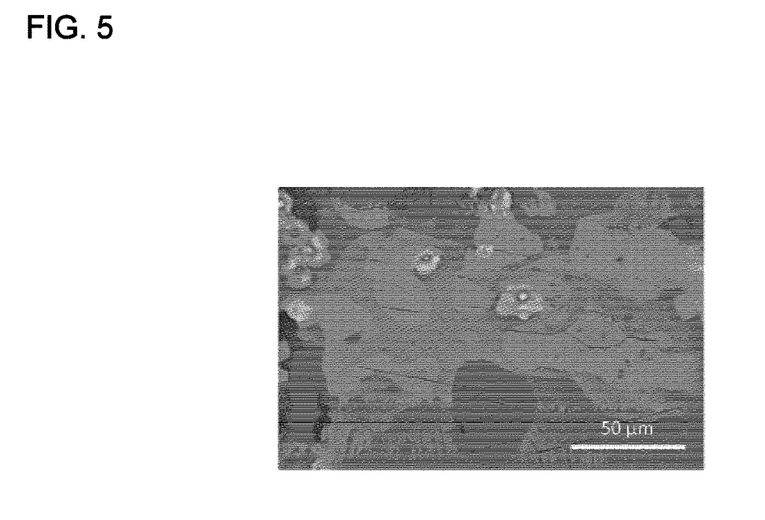
FIG. 5 is a polarization microscope photograph of an organic semiconductor film (3) according to the present embodiment.

A silicon substrate was used as the substrate. Since the silicon substrate is doped with n-type carriers at a high density, it may be used also as the gate electrode. The silicon substrate was used on which the gate insulating film having the thickness of 100 nm was formed by a thermal oxidation method. The coating liquid was coated on the substrate by the edge casting method at a substrate temperature of 100° C. to produce the organic semiconductor film. Polarization microscope photographs of the produced organic semiconductor film are shown in FIG. 3 to FIG. 5. FIG. 3 shows a case where the substrate is moved at a speed (film-forming speed) of 20 μm/sec when the coating liquid is supplied; FIG. 4 shows a case where the film-forming speed is set at 40 μm/sec; and FIG. 5 shows a case where the film-forming speed is set at 80 μm/sec. It was confirmed from the figures that the organic semiconductor film in which the orientations were aligned was obtained irrespective of the speed of the substrate.

Next, eight organic FETs were fabricated according to Example (abbreviated as Ex. in Tables below) 1, in which the organic semiconductor film having the thickness of approximately 100 nm was formed on the substrate with the use of the above-described coating liquid, at the film-forming speed set at 80 μm/sec. In order to form the source electrode and the drain electrode, gold was formed into a film having the thickness of 40 nm by a vacuum deposition method. The organic FET was fabricated so that the channel width was 2 mm and the channel length was 50 μm to 100 μm.

Eight organic FETs according to each of Examples 2 to 4 were fabricated similarly to those in Example 1, except that the solvent and/or the film-forming speed were changed. Eight organic FETs were fabricated according to each of Comparative Examples (abbreviated as C. Ex. in Tables below) 1 to 3, which were different from Examples 1 to 3 only in that the coating liquid did not contain the polymer material.

Figure 6:
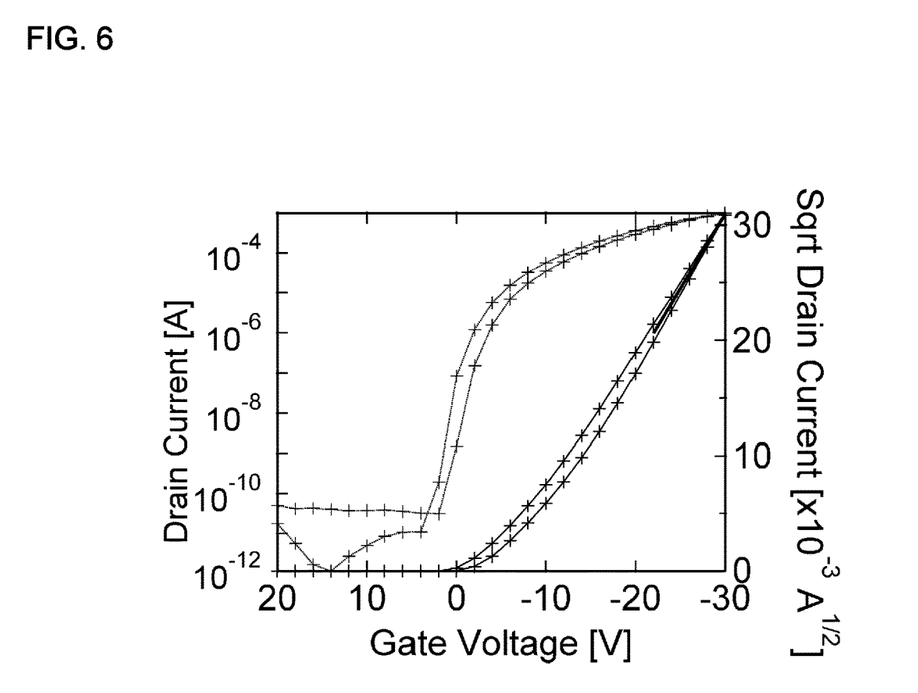
FIG. 6 is a graph showing a result of the measured charge mobility of an organic FET according to the present embodiment.

The charge mobility was measured on the organic FETs of Examples 1 to 4 and Comparative Examples 1 to 3 fabricated as described above. A semiconductor parameter analyzer (model number: 4200-SCS, made by TFF Keithley Instruments Co., Ltd.) was used for the measurement of the charge mobility. The results are shown in Table 1. The measurement data of the organic FETs of Example 1 is shown in FIG. 6 (charge mobility of 8.5 cm$^2$/Vs). In FIG. 6, the vertical axis on the left side represents a drain current (A), the vertical axis on the right side represents the square root of the drain current ($\times 10^{-3}$ A$^{1/2}$), and the horizontal axis represents the gate voltage (V). The diagram on the left side in the figure shows the drain current, and the diagram on the right side shows the square root of the drain current.

The charge mobility shown in Table 1 is an average value of 8 samples. It was confirmed from the results that each of the organic FETs of Examples 1 to 4 achieved high charge mobility as compared with the organic FETs of the comparative examples. In particular, in Comparative Examples 2 and 3, the charge mobilities decreased extremely. As for Comparative Examples 2 and 3, it is considered that the film-forming speeds are faster than that in Comparative Example 1, so that the orientation in the organic semiconductor films was deteriorated. Accordingly, the charge mobility extremely decreased. On the other hand, Examples 1 and 2 achieved higher charge mobilities than those of Examples 3 and 4. That is, in the organic semiconductor film according to the present embodiment, high charge mobility is achieved even when the film-forming speed is high. From the above, it can be said that the fabrication method according to the present embodiment facilitates the fabrication of the organic semiconductor film in which the orientations are aligned, as compared with the conventional methods.

TABLE 1

| Sample | Ex. 1 | Ex. 2 | Ex. 3 | Ex. 4 | C. Ex. 1 | C. Ex. 2 | C. Ex. 3 |
|---|---|---|---|---|---|---|---|
| Semiconductor material | C10-DNBDT | C10-DNBDT | C10-DNBDT | C10-DNBDT | C10-DNBDT | C10-DNBDT | C10-DNBDT |
| Solvent | 3CT | 3CT | 3CT | CB | 3CT | 3CT | 3CT |
| Polymer compound | PMMA | PMMA | PMMA | PMMA | — | — | — |
| Film-forming speed μm/sec | 80 | 40 | 20 | 20 | 20 | 40 | 80 |
| Mobility cm$^2$/Vs (average) | 10.6 | 13.5 | 8.6 | 8.1 | 6.8 | $2.8 \times 10^{-3}$ | $3.1 \times 10^{-3}$ |

Next, an axial direction of the organic semiconductor film was measured. Thin films according to Examples 5 to 9 were produced similarly to that in Example 1, except that the solvent, the film-forming speed or the polymer compound was changed. An X-ray diffractometer (SmartLab made by Rigaku Corporation) was used for the measurement of the axial direction. Table 2 shows the results of the standard deviations that have been determined from the obtained axial directions. The axial directions shown in this table are each a standard deviation of axial directions of crystals which exist in a measurement spot of 1.5 cm square. The above results show that the organic semiconductor films of Examples 5 to 9 have their orientations aligned to a certain extent.

TABLE 2

| Sample | Ex. 5 | Ex. 6 | Ex. 7 | Ex. 8 | Ex. 9 |
|---|---|---|---|---|---|
| Semiconductor material | C10-DNBDT | C10-DNBDT | C10-DNBDT | C10-DNBDT | C10-DNBDT |
| Solvent | 3CT | 3CT | CB | CB | CB |
| Polymer compound | PMMA | PMMA | PMMA | P4MS | PS |
| Film-forming speed μm/sec | 20 | 80 | 40 | 40 | 40 |
| Axial direction (standard deviation) | 19.7 | 33.4 | 24.9 | 33.8 | 36.5 |

(Modified Example)

The present invention is not limited to the above-described embodiment, and can be appropriately changed within the scope of the spirit of the present invention.

In the above-described embodiment, for instance, the case has been described where the coating liquid has been applied by the edge casting method, but the present invention is not limited to the case, and may be applied by an ink jet method. The ink jet method is not limited in particular, and for instance, a piezo type ink jet, a bubble jet (registered trademark) type ink jet or the like can be used. For instance, in the nozzle of the piezo type ink jet, a piezo element is provided. The piezo element is connected to an alternating current power supply through a circuit. In order to apply the coating liquid by the ink jet method, first, the piezo element atomizes the coating liquid, which has been supplied to the nozzle, into coating particles having a uniform size, by vibration of the piezo element. The coating particles reach the surface of the gate insulating film formed on the gate electrode, which is the substrate. The substrate is moved so that the amount of the coating particles on the gate insulating film is constant while the coating particles are supplied continuously. In the coating particles which have reached the gate insulating film, the crystallization of the organic semiconductor material progresses as the solvent evaporates. Thus, the organic semiconductor film in which the orientations are aligned is fabricated, similarly to the above-described embodiment.

Figure 7:
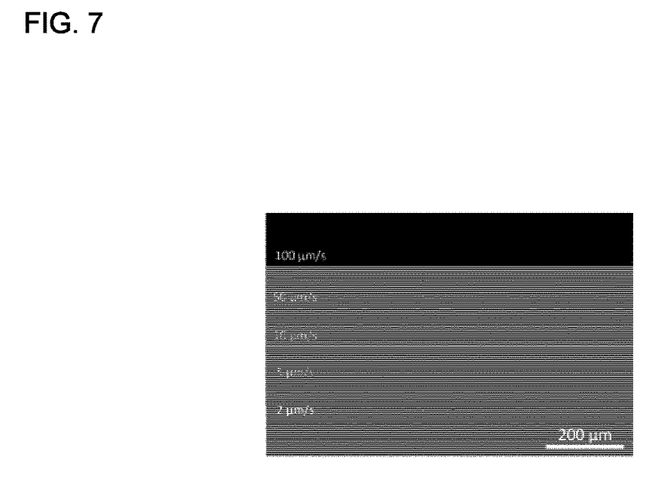
FIG. 7 is a polarization microscope photograph of an organic semiconductor film according to Modified Example (1).

The organic semiconductor film was fabricated by the ink jet method according to the present modified example. First, the coating liquid was prepared by mixing and dissolving 1.00 wt % of $C_{10}$-DNTVW, which was used as the semiconductor material, and 1.00 wt % of PMMA, which was used as the polymer material, in 1CN, which was used as the solvent. The organic semiconductor film was fabricated with the use of an ink jet device (model number: ST050-ODT, made by SIJ Technology, Inc.) while the speed of the substrate during the application of the coating liquid was changed from 2 to 100 μm/sec. A polarization microscope photograph of the fabricated organic semiconductor film is shown in FIG. 7. The substrate, the source electrode, and the drain electrode were the same as or similar to those in Example 1. It is understood from the figure that a linear organic semiconductor film is formed by the ink jet method, and the width of the organic semiconductor film is changed by changing the speed.

Figure 8A:
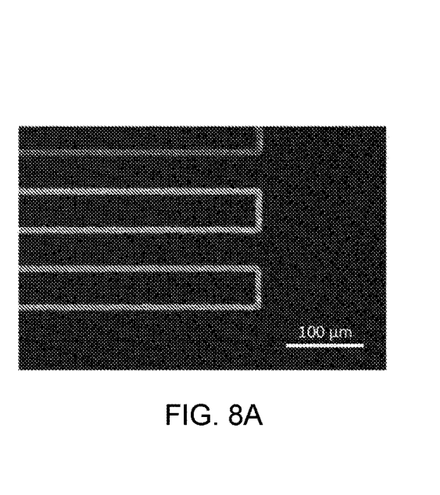
Figure 8B:
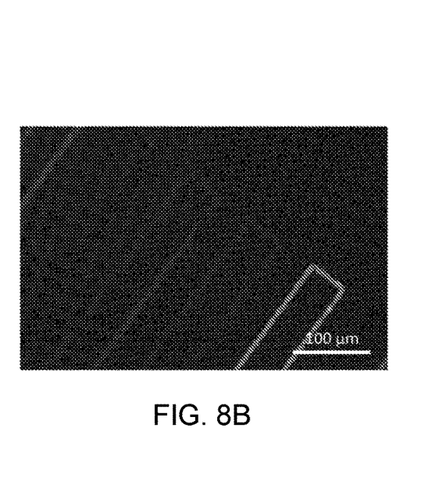

A staple-shaped organic semiconductor film was fabricated with the use of the above-described coating liquid, at a film-forming speed set to 5 μm/sec. Polarization microscope photographs of the film are shown in FIGS. 8A and 8B. FIG. 8A is a photograph at a diagonal position; and FIG. 8B is a photograph at an extinction position. It was confirmed from the figures that in the linear organic semiconductor film which was fabricated by the ink jet method, the orientations were aligned even when the direction of the line was changed. It is confirmed from the figures that the organic semiconductor film in which the orientations are aligned and having the length of 200 μm or more is formed according to the present embodiment.

Figure 9:
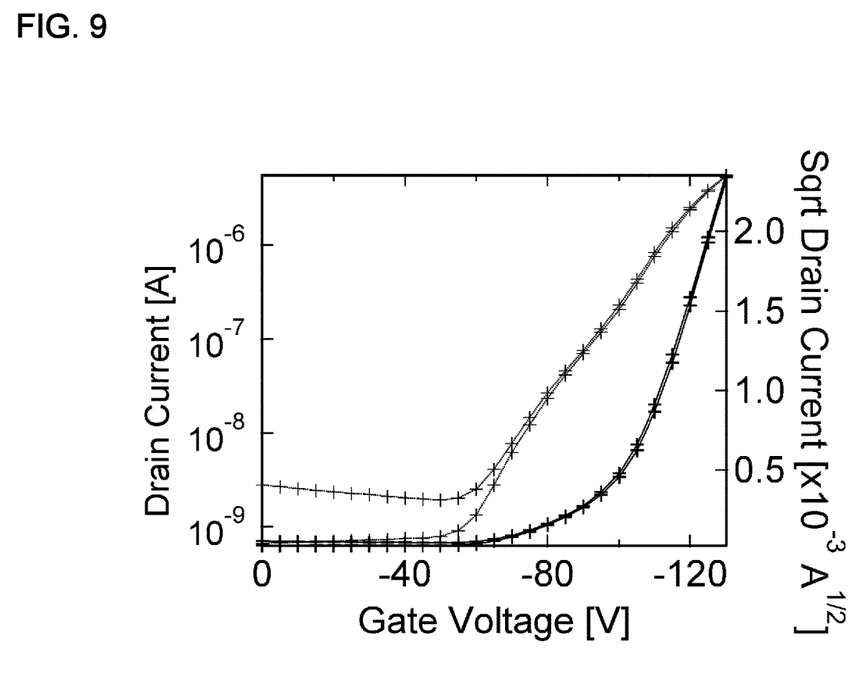
FIG. 9 is a graph showing a result of a measured charge mobility of the organic FET according to Modified Example (1).

Next, an organic FET, in which an organic semiconductor film was formed on a substrate with the use of the above-described coating liquid, of Example 10 was fabricated at a film-forming speed set at 5 μm/sec. The charge mobility was measured on the obtained organic FET of Example 10. The result is shown in Table 3. One of measurement data is shown in FIG. 9 (charge mobility of 2.1 cm$^2$/Vs). The charge mobility shown in Table 3 is an average value of two samples. As is clear from Table 3, it was found that the organic FET of Example 10 achieves high charge mobility of the same level as that of the organic FET according to the above-described embodiment.

TABLE 3

| Sample | Ex. 10 |
| --- | --- |
| Semiconductor material | C10-DNTVW |
| Solvent | 1CN |
| Polymer compound | PMMA |
| Film-forming speed μm/sec | 5 |
| Mobility cm$^2$/Vs (average) | 1.7 |

Figure 10:
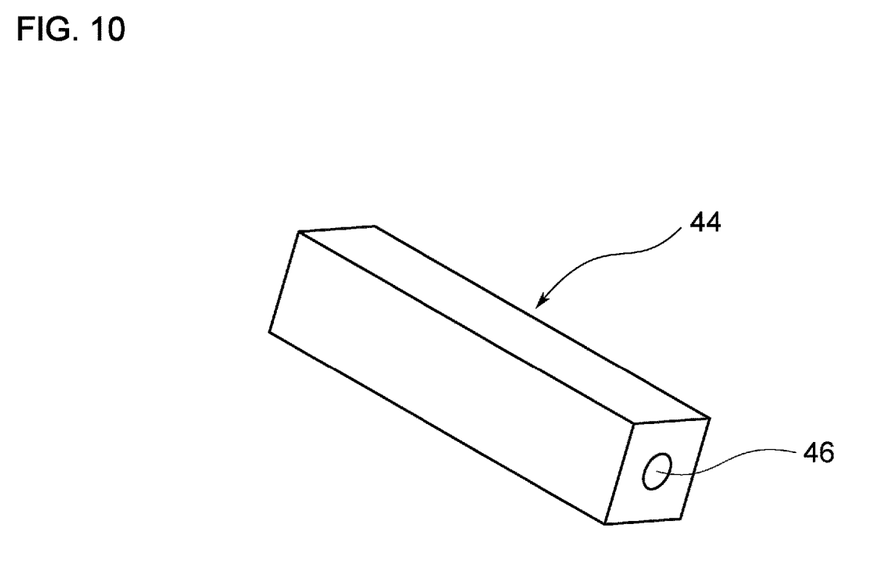
FIG. 10 is a perspective view schematically showing a nozzle which is used in a fabrication method of an organic semiconductor film according to Modified Example (2).
Figure 11:
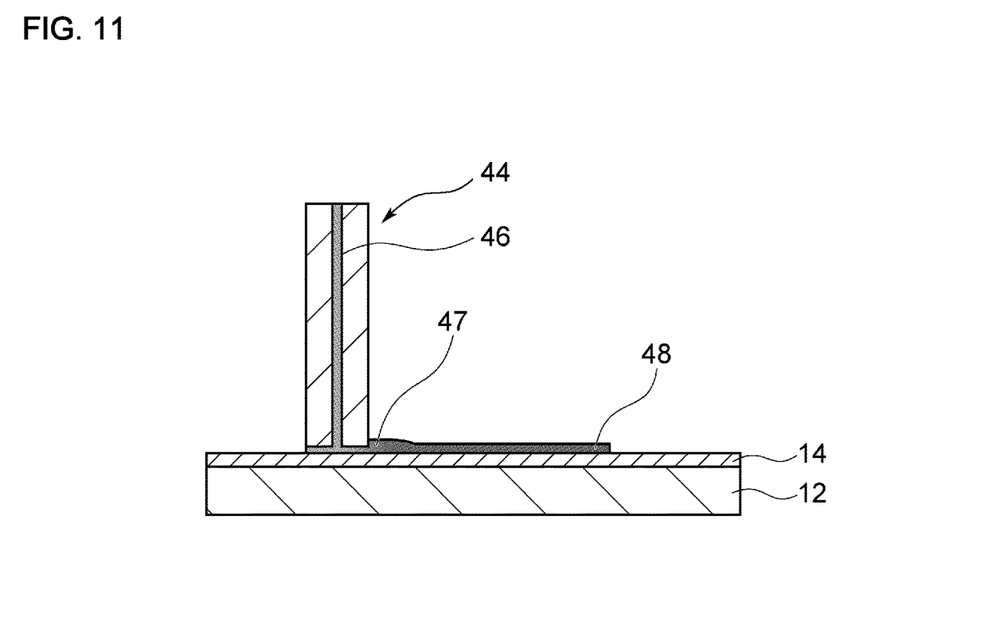
FIG. 11 is a view schematically showing the fabrication method of the organic semiconductor film according to Modified Example (2).

A nozzle 44 having a prismatic shape shown in FIG. 10 may be used for applying the coating liquid. As for the nozzle 44 shown in the figure, a bottom surface is 1 mm square or smaller, and a flow path 46 is formed in the longitudinal direction, approximately in the center. As is shown in FIG. 11, the nozzle 44 is disposed above the gate insulating film 14 formed on the gate electrode 12, which is the substrate, and the coating liquid is supplied from the flow path 46. Thus, the coating liquid is applied. Thereby, the coating liquid is applied to a narrower region than that in the above-described embodiment, and a linear organic semiconductor film 48 is fabricated.

The organic semiconductor film was formed with the use of the nozzle 44 of 1 mm square with the flow path 46 of 0.4 mm, and the organic FET was fabricated by using the organic semiconductor film. First, a coating liquid was prepared by mixing and dissolving 0.10 wt % of C$_{10}$-DNBDT, which was used as the semiconductor material, and 0.10 wt % of PMMA, which was used as the polymer material, in 3CT, which was used as the solvent. The organic FET of Example 11 was fabricated by forming the organic semiconductor film on the substrate with the use of the above-described coating liquid and the nozzle shown in FIG. 10, at the film-forming speed set at 40 μm/sec and at the temperature set at 104° C. The substrate, the source electrode, and the drain electrode were the same as or similar to those in Example 1.

Figure 12:
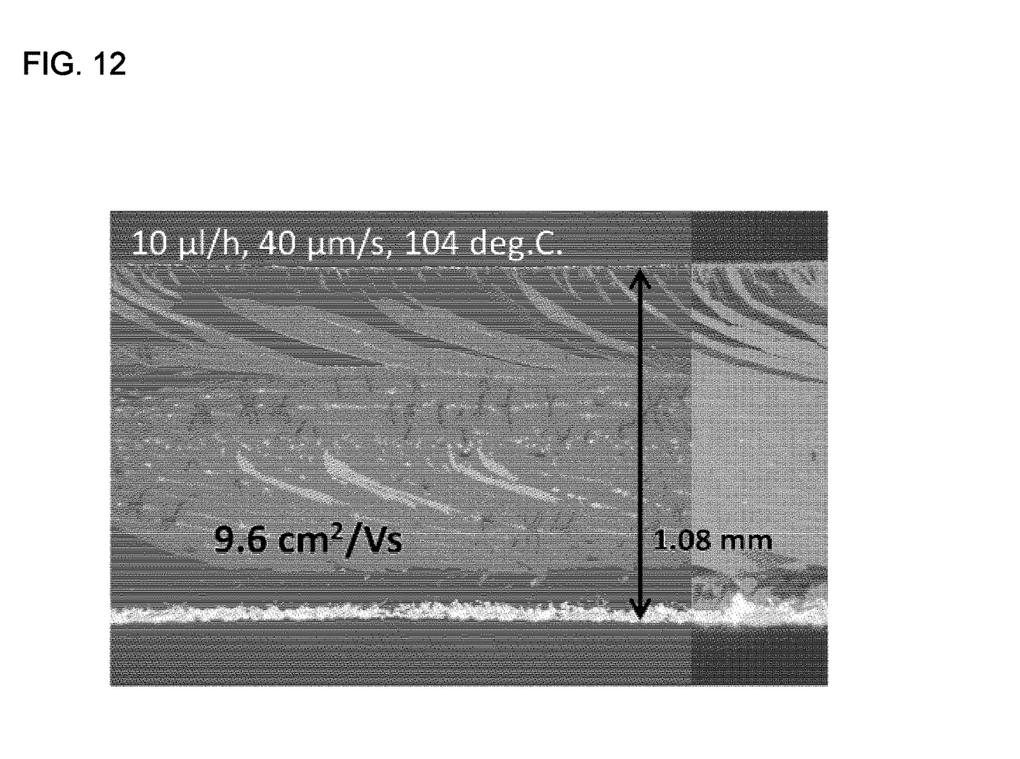
FIG. 12 is an optical microscope photograph of the organic semiconductor film according to Modified Example (2).

An optical microscope photograph of the fabricated organic semiconductor film is shown in FIG. 12. It was confirmed from the figure that with the use of the nozzle 44 according to the present modified example, the linear organic semiconductor film with the width of approximately 1 mm and in which the orientations were aligned was fabricated.

Figure 13:
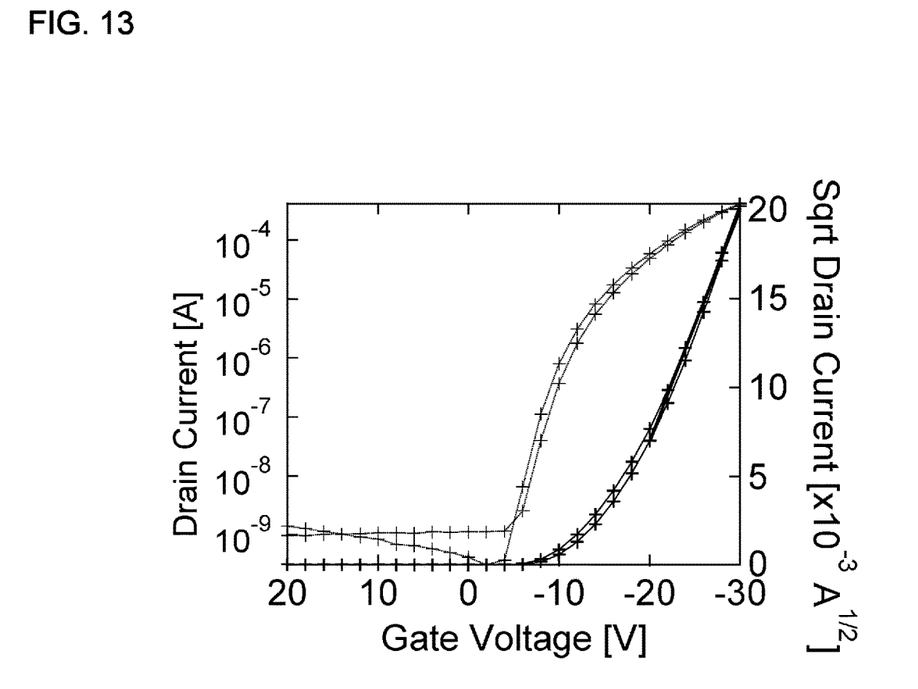
FIG. 13 is a graph showing a result of a measured charge mobility of an organic FET according to Modified Example (2).

Next, the charge mobility was measured on the obtained organic FET. The result is shown in Table 4. Measurement data is shown in FIG. 13 (charge mobility of 9.6 cm$^2$/Vs). The charge mobility shown in Table 4 is an average value of 6 samples. As is clear from Table 4, it was found that the organic FET of the present modified example achieved high charge mobility of the same level as that of the organic FET according to the above-described embodiment.

TABLE 4

| Sample | Ex. 11 |
| --- | --- |
| Semiconductor material | C10-DNBDT |
| Solvent | 3CT |
| Polymer compound | PMMA |
| Film-forming speed μm/sec | 40 |
| Mobility cm$^2$/Vs (average) | 5.8 |

Figure 14:
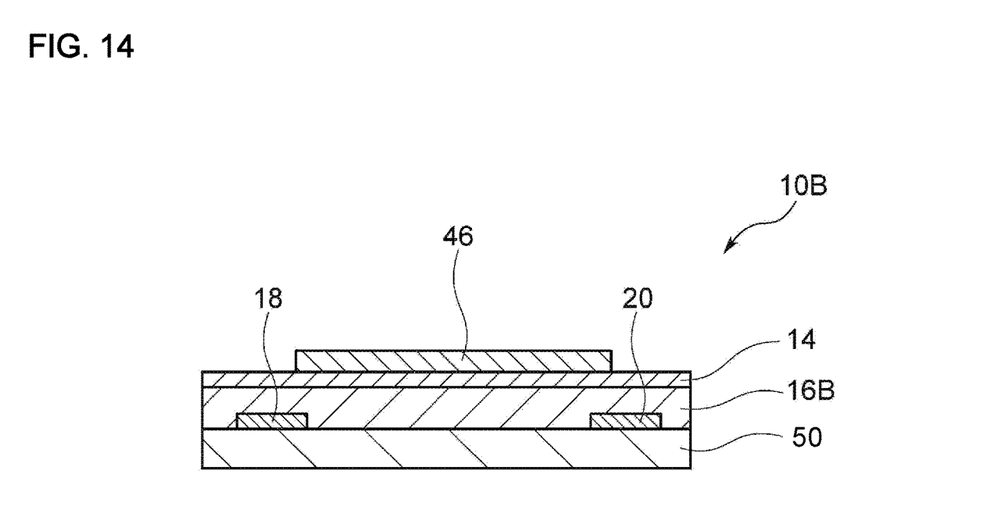
FIG. 14 is a longitudinal sectional view showing a schematic configuration of an organic FET according to Modified Example (3).

In the above-described embodiment, the case has been described in which the organic FET has been a bottom gate and top contact type, but the present invention is not limited to the above case, and may be a top gate and bottom contact type as is shown in FIG. 14. In the organic FET 10B shown in the figure, the source electrode 18 and the drain electrode 20 are formed on a substrate 50; and an organic semiconductor film 16B, a gate insulating film 14, and a gate electrode 46 are formed in this order. In the organic semiconductor film 16B, the layer-shaped semiconductor portion is formed on the layer-shaped polymer portion. Hence, the source electrode 18 and the drain electrode 20 are covered with the polymer portion of the organic semiconductor film 16B. In order to electrically connect the source electrode 18 with the drain electrode 20, the polymer portion needs to have electric conductivity. In this case, for instance, when a p-type organic semiconductor material is used as a low-molecular organic semiconductor material, examples of usable polymer material include a p-type high-molecular organic semiconductor material such as PTAA (Poly[bis(4-phenyl) (2,4,6-trimethylphenyl) amine]) and F8BT (Poly([9,9-di-n-octylfluorenyl-2,7-diyl]-alt-(benzo[2,1,3]thiadiazol-4,8-diyl)]). When an n-type organic semiconductor material is used as the low-molecular organic semiconductor material, an n-type high-molecular organic semiconductor material such as BBL (Poly(benzimidazobenzophenanthroline)) may be used as the polymer material.

The organic FET 10B was fabricated. First, a coating liquid was prepared by mixing and dissolving 0.025 wt % of C$_{10}$-DNBDT, which was used as the semiconductor material, and 0.025 wt % of PTAA, which was used as the polymer material, in 3CT, which was used as the solvent. The organic FET of Example 12 was fabricated by forming an organic semiconductor film on a substrate with the use of the above-described coating liquid, at the film-forming speed set at 40 μm/sec and at the temperature set at 100° C. Non-alkali glass was used as the substrate. Gold was vacuum-deposited on the substrate to form the source and drain electrodes. An organic semiconductor composite film was formed by a continuous edge casting method on the glass substrate having the source and drain electrodes formed thereon, and a thin film of CYTOP (CTL-809M, made by Asahi Glass Co., Ltd.) and parylene was formed as a gate insulating film. An aluminum film was formed as a gate electrode by a vacuum deposition method.

Figure 15:
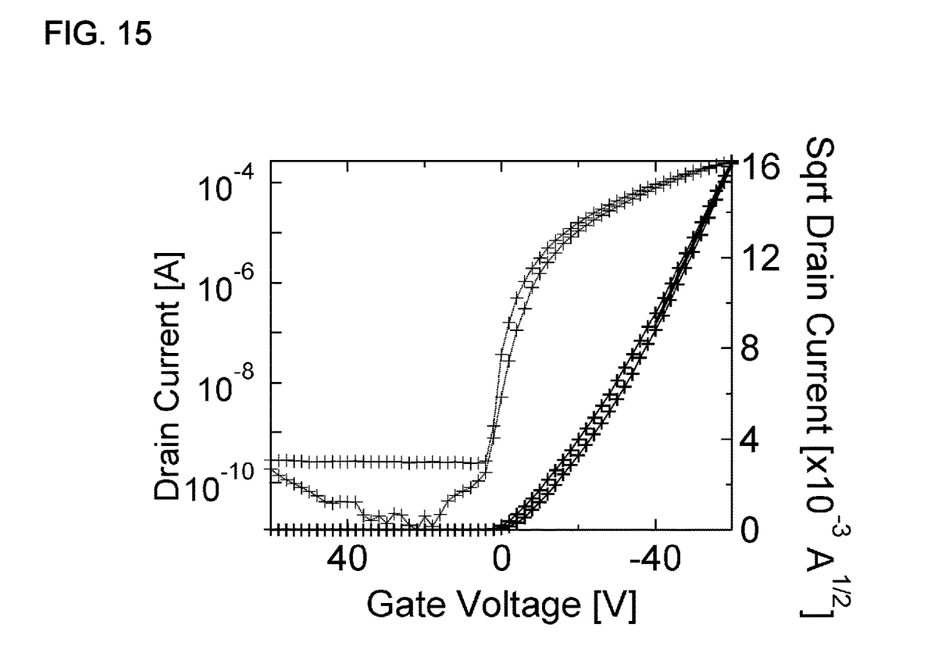
FIG. 15 is a graph showing a result of a measured charge mobility of the organic FET according to Modified Example (3).

Next, the charge mobility was measured on the obtained organic FET. The result is shown in Table 5. Measurement data is shown in FIG. 15 (charge mobility of 4.6 cm$^2$/Vs). The charge mobility shown in Table 5 is an average value of 12 samples. As is clear from Table 5, it was found that the organic FET of the present modified example achieves high charge mobility of the same level as that of the organic FET according to the above-described embodiment.

TABLE 5

| Sample | Ex. 12 |
| --- | --- |
| Semiconductor | C10-DNBDT |

TABLE 5-continued

| Sample | Ex. 12 |
| --- | --- |
| material | |
| Solvent | 3CT |
| Polymer compound | PTAA |
| Film-forming speed μm/sec | 40 |
| Mobility cm$^2$/Vs (average) | 2.2 |

Figure 16:
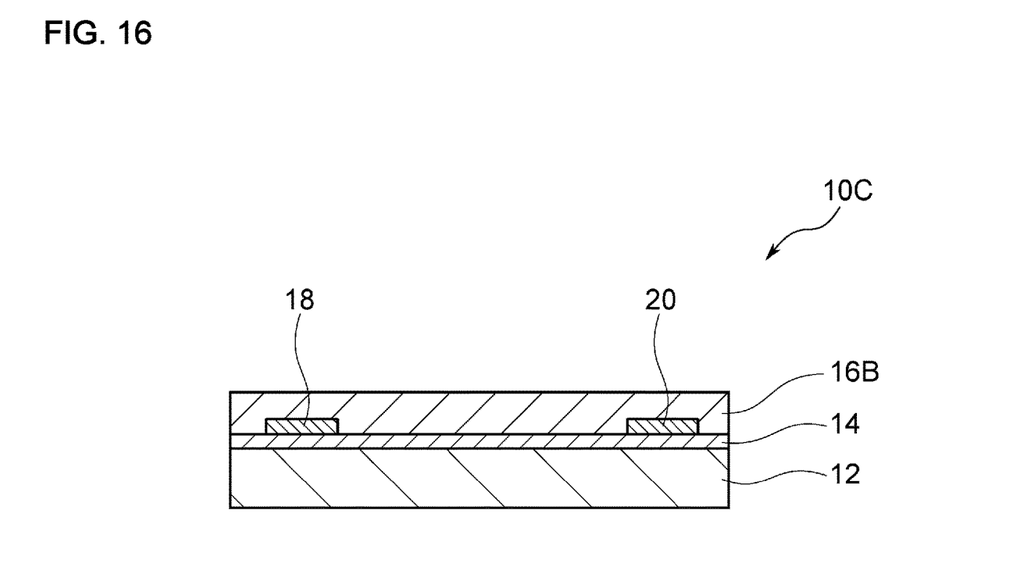
FIG. 16 is a longitudinal sectional view showing a schematic configuration of an organic FET according to Modified Example (4).
Figure 17:
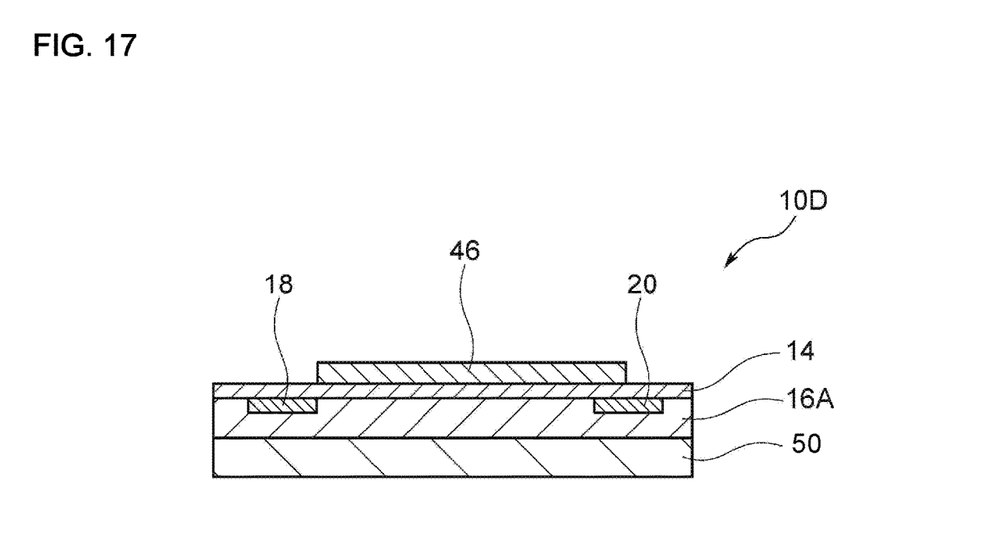
FIG. 17 is a longitudinal sectional view showing a schematic configuration of an organic FET according to Modified Example (5).

Furthermore, the organic FET can be applied to a bottom gate and bottom contact type organic FET 10C shown in FIG. 16, and a top gate and top contact type organic FET 10D shown in FIG. 17.

In the case of the above-described embodiment, the case has been described in which the semiconductor portion is formed from the organic semiconductor material, but the present invention is not limited to the above case, and an inorganic semiconductor material may be used as long as the material are dissolved in a solvent. Examples of the inorganic semiconductor material include ZnO, SnO, and Indium gallium zinc oxide (IGZO). Examples of the polymer material which can be used in this case include polyvinyl alcohol, polyvinyl pyrrolidone, and polyethylene glycol. Examples of the solvent include water, ethylene glycol, and propylene glycol.

In the case of the above-described embodiment, the case has been described in which the substrate is moved with respect to the nozzle, but the present invention is not limited to the case. At least one of the substrate and the nozzle is moved relative to the other, and it is also acceptable that the substrate is fixed and the nozzle is moved.

A coating liquid was prepared by mixing and dissolving 0.025 wt % of $C_{10}$-DNBDT, which was used as the semiconductor material, and 0.025 wt % of PMMA, which was used as the polymer material, in 3CT, which was used as the solvent. The organic semiconductor film having the thickness of approximately 30 nm was formed on the substrate with the use of the above-described coating liquid, at the film-forming speed set at 80 μm/sec.

Figure 18A:
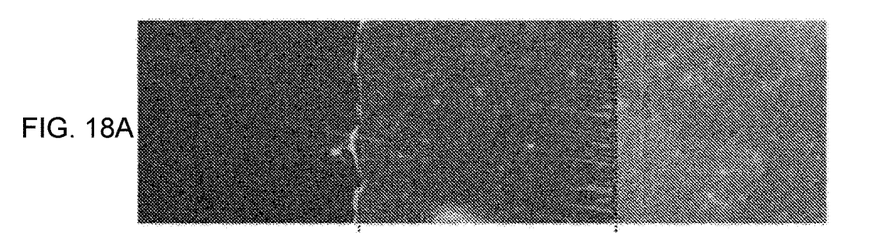
Figure 18B:
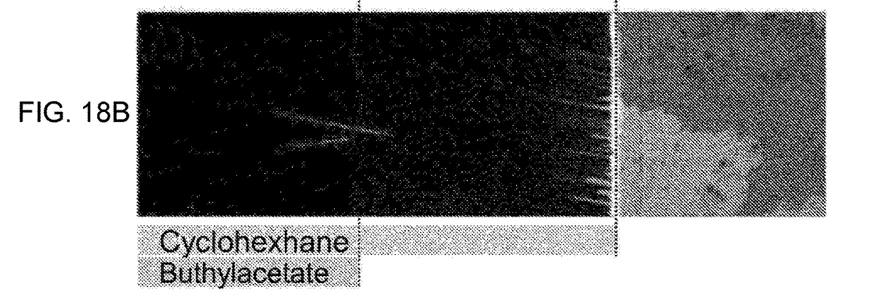
Figure 18C:
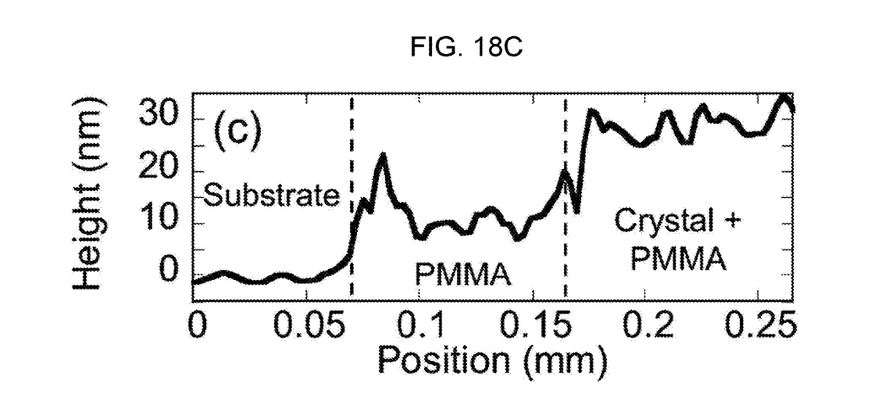

Data of evaluation of the obtained organic semiconductor film is shown in FIGS. 18A to 18C. FIG. 18A is an optical microscope photograph of the organic semiconductor film, and FIG. 18B is a polarization microscope photograph. FIG. 18C is a result of measurement of the height of the surface measured with the use of AFM. The horizontal axis represents the position (mm) corresponding to the positions in FIG. 18A and FIG. 18B, and the vertical axis represents the height (nm).

In each of FIG. 18A and FIG. 18B, the right side is a photograph of an organic semiconductor film after the film formation; the center is a photograph of the surface from which the semiconductor material was removed by cleaning using cyclohexane after the film formation; and the left side is a photograph of the surface from which the semiconductor material and the polymer material were removed by cleaning using butyl acetate after the cleaning using the cyclohexane.

As is shown in FIG. 18B, only the right side of the polarization microscope photograph is bright, and accordingly it is understood that the semiconductor portion exists on the surface of the organic semiconductor film after the film formation. It is understood from the result of the height measurement in FIG. 18C that the polymer portion exists between the substrate and the semiconductor portion existing on the surface of the organic semiconductor film.

Figure 19A:
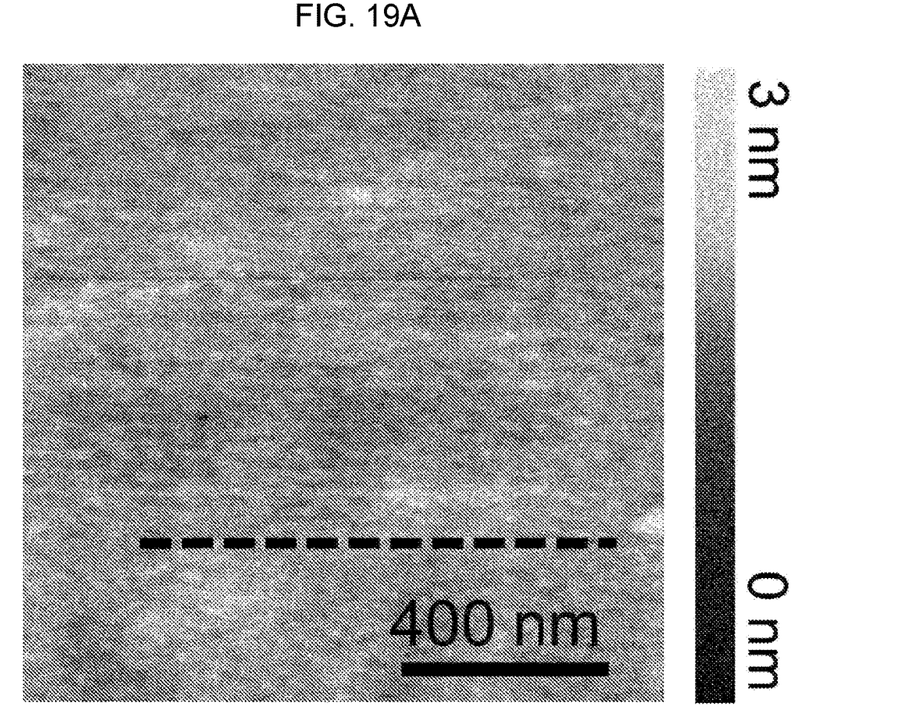
Figure 19B:
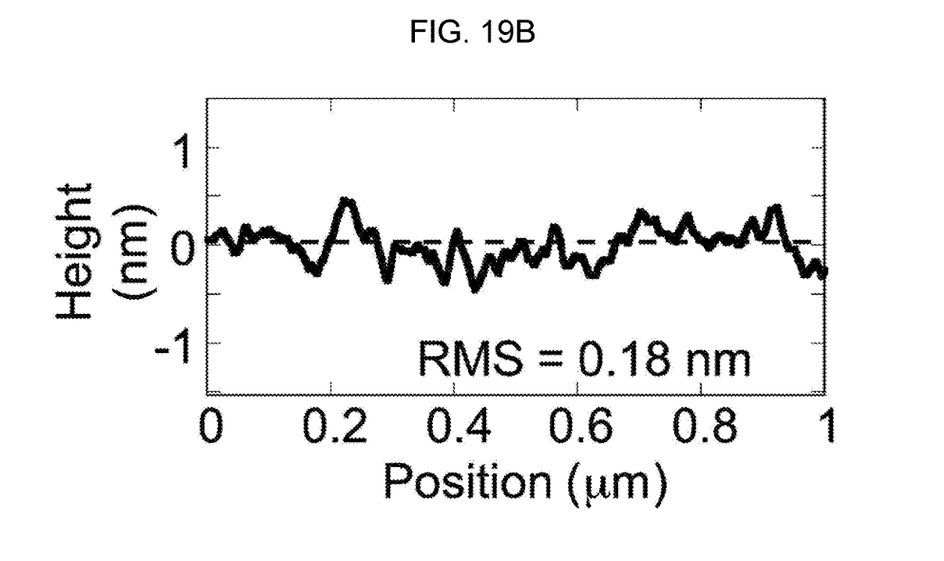

FIG. 19A shows an AFM image of the surface of the organic semiconductor film after the film formation, from which the semiconductor material has been removed by cleaning using cyclohexane, in other words, the polymer portion is exposed from the surface. FIG. 19B shows the result of the measurement of the height of the dotted line portion in FIG. 19A. The horizontal axis represents the position (μm) and the vertical axis represents the height (nm). The root mean square value calculated from the height measurement result was 0.18 nm. This result shows that a flatter surface has been formed between the semiconductor portion and the polymer portion, through the step of forming the organic semiconductor film.

Figure 20A:
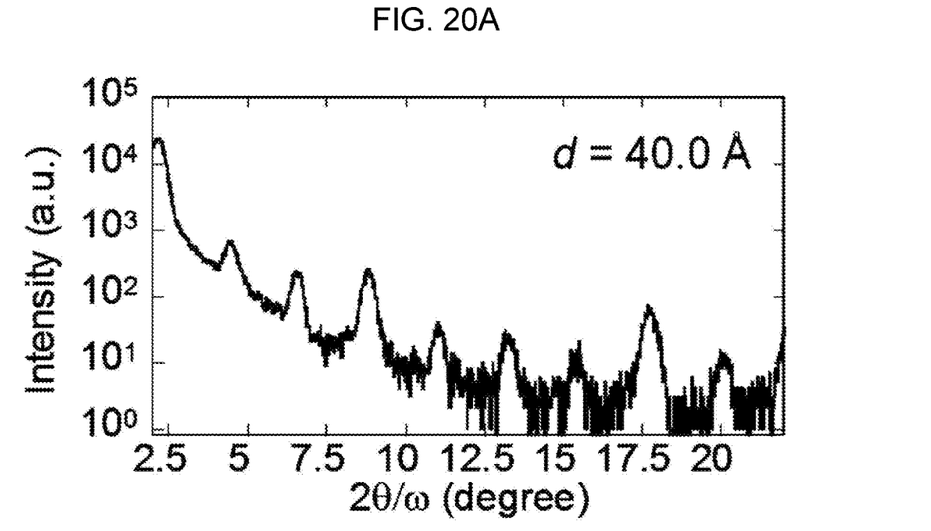
Figure 20B:
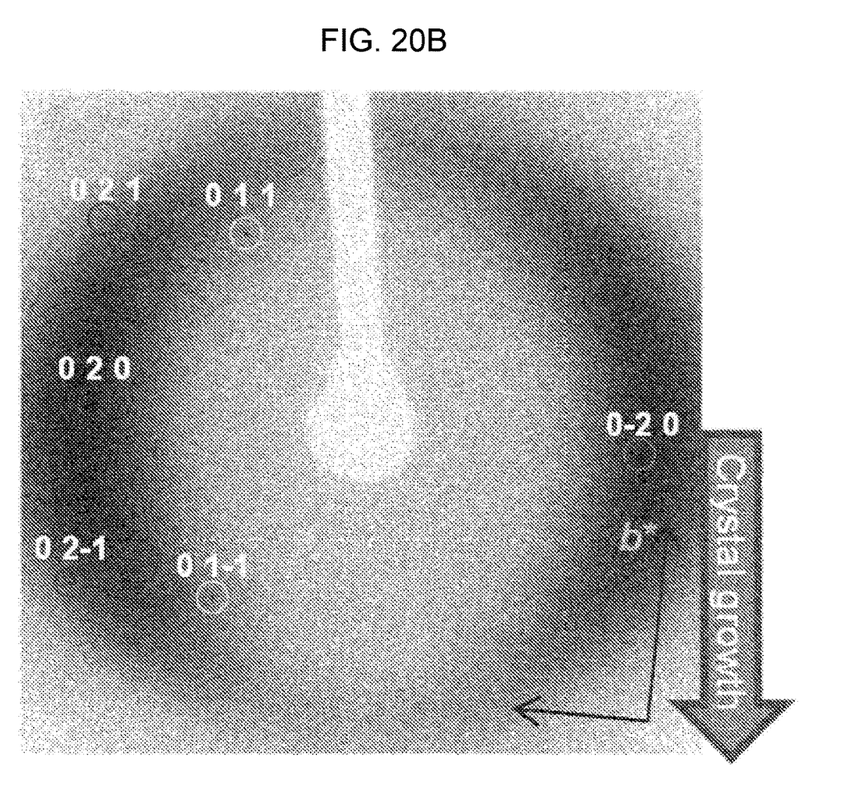

Furthermore, a crystal structure of the organic semiconductor film was examined. The result is shown in FIGS. 20A and 20B. FIG. 20A shows an out-of-plane XRD pattern, and FIG. 20B shows a transmission type XRD image. It has been confirmed from FIG. 20A that the crystalline orientation in the organic semiconductor film is 5 degrees or less. In addition, as shown in FIG. 20B, Laue spots were confirmed on the b-c face. The result indicates that the organic semiconductor film in a range irradiated with X rays (80 μm square) is single crystal.

REFERENCE SIGNS LIST 10A organic FET (field effect transistor)
12 gate electrode (substrate)
14 gate insulating film (substrate)
16A organic semiconductor film (semiconductor film)

The invention claimed is:
1. A semiconductor film comprising:
   a semiconductor portion that is formed from an organic semiconductor material and comprises crystals and has a width of 1 mm or more; and
   a polymer portion that is formed from a polymer material, wherein:
   each of the semiconductor portion and the polymer portion has a layer shape, and the semiconductor portion and the polymer portion are stacked adjacent to each other in a stacking direction,
   an angle between orientation axes of the crystals is 10 degrees or less, and
   each crystal has a length of 200 μm or more.
2. The semiconductor film according to claim 1, wherein the semiconductor portion is a single crystal.
3. A field effect transistor comprising the semiconductor film according to claim 1.

* * * * *